(12) United States Patent
Johnson

(10) Patent No.: US 6,994,918 B2
(45) Date of Patent: Feb. 7, 2006

(54) SELECTIVE APPLICATION OF CONDUCTIVE MATERIAL TO CIRCUIT BOARDS BY PICK AND PLACE

(76) Inventor: Morgan T. Johnson, 2370 SW. Cedar, Portland, OR (US) 97205

(*) Notice: Subject to any disclaimer, the term of this patent is extended or adjusted under 35 U.S.C. 154(b) by 0 days.

(21) Appl. No.: 10/917,029

(22) Filed: Aug. 11, 2004

(65) Prior Publication Data

US 2005/0035462 A1 Feb. 17, 2005

Related U.S. Application Data

(60) Provisional application No. 60/494,710, filed on Aug. 12, 2003.

(51) Int. Cl.
*B32B 15/00* (2006.01)
*H05K 7/10* (2006.01)

(52) U.S. Cl. .................. 428/618; 428/615; 428/617; 257/779; 361/751; 361/808

(58) Field of Classification Search ............... 428/209, 428/901, 615, 617–618; 257/779; 361/751, 361/808
See application file for complete search history.

(56) References Cited

U.S. PATENT DOCUMENTS

| | | | | |
|---|---|---|---|---|
| 3,986,939 | A | * | 10/1976 | Prest .......................... 205/162 |
| 4,940,181 | A | * | 7/1990 | Juskey et al. .......... 228/180.21 |
| 5,356,526 | A | * | 10/1994 | Frankenthal et al. ........ 205/122 |
| 5,829,124 | A | * | 11/1998 | Kresge et al. ................ 29/840 |
| 6,211,571 | B1 | * | 4/2001 | Zakel et al. ................ 357/780 |
| 6,331,347 | B2 | * | 12/2001 | Haji ........................... 428/209 |
| 6,359,233 | B1 | * | 3/2002 | Joy et al. .................... 174/255 |
| 6,841,228 | B2 | * | 1/2005 | Edwards et al. ............ 428/209 |

\* cited by examiner

*Primary Examiner*—Cathy F. Lam
(74) *Attorney, Agent, or Firm*—Werner & Arenfeld, LLP

(57) ABSTRACT

A component for use in manufacturing circuit boards, such as printed circuit boards, or flex substrates is adapted for use with pick-and-place equipment to provide a first material overlay disposed over a second material base layer. Such a component may include a first electrically conductive material disposed over a second electrically conductive material, and a soluble tape backing disposed over and attached to the second electrically conductive material. The component may be attached to a circuit board by solder relow, after which the soluble tape backing is removed. Although typical embodiments involve electrically conductive materials, it is noted that an electrically insulating material can also be disposed over and attached to an underlying material which itself is disposed on a circuit board.

6 Claims, 6 Drawing Sheets

Fig. 4
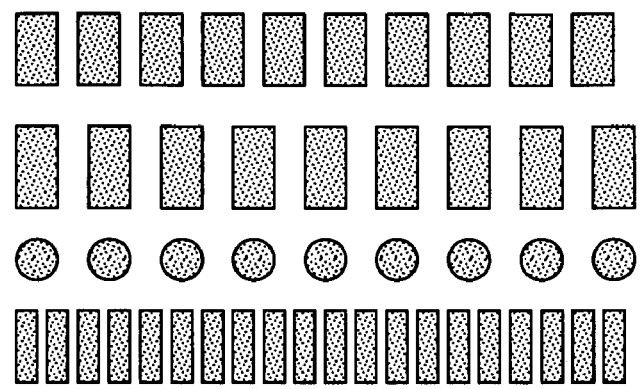
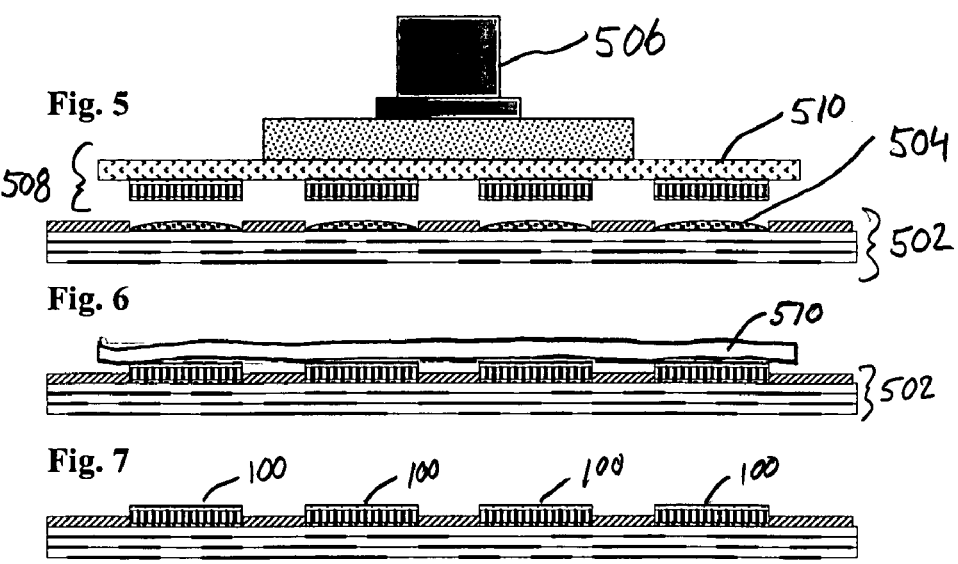
Fig. 5
Fig. 6
Fig. 7

Step 10

SELECTIVE APPLICATION OF CONDUCTIVE MATERIAL TO CIRCUIT BOARDS BY PICK AND PLACE

CROSS-REFERENCE TO RELATED APPLICATIONS

This application claims the benefit of earlier filed provisional Application No. 60/494,710, filed 12 Aug. 2003, and entitled "Selective Application Of Conductive Material To Circuit Boards By Pick And Place".

FIELD OF THE INVENTION

The present invention relates generally to electronic product manufacturing, and more particularly relates to the application of conductive material to selected areas of a circuit substrate, such as a board, by pick and place operations.

BACKGROUND

Many electronic products are provided in the form of a plurality of components, such as, electrical circuit elements and/or integrated circuits, mounted upon an underlying substrate, wherein that substrate provides various conductive paths between two or more of the mounted components, and/or between at least one of the mounted components and an external connection terminal. One well known form of substrate for mounting components and for providing the aforementioned conductive paths is the printed circuit board.

Printed circuit board manufacturing generally involves the formation of a plurality of conductive traces disposed on at least one major surface of a generally planar, generally rigid, insulating material. Many insulating materials have been used to form substrates for electronic products, such as, but not limited to, FR4, epoxy, and ceramics. Printed circuit boards may have conductive traces disposed on each of two opposing sides thereof. Similarly, printed circuit boards may have one or more layers of conductive traces disposed within the insulating material. Printed circuit boards may have holes, or openings, therethrough for the mounting of components, mechanical alignment of the printed circuit board to another unit, or plated through holes for the interconnection of the various layers of conductive traces.

A substrate similar to the printed circuit board, but which is not generally rigid, is referred to herein as a flex substrate. Such flex materials with patterned conductive traces are well known in the electronic arts and have been used for a variety of applications including backplane connector cables, and for providing a base upon which components may be attached.

A common manufacturing process for forming conductive traces on printed circuit boards, includes forming a blanket layer of conductive material and then etching away certain portions so as to form spaces between the remaining conductive material which, subsequent to this etching operation, is in the form of conductive traces. A commonly used conductive material for such applications is copper.

In certain circumstances, conductive material with chemical and electrical properties different from those of copper are required. One conductive material that is used in such circumstances is gold. Gold has a lower electrical resistivity than copper, and this lower electrical resistivity provides for improved electrical performance in many types of electrical circuits. Additionally, gold, as compared to copper, has the desirable property of being less reactive to atmospheric gases, and hence is less likely to corrode.

Those skilled in the electronic arts in general, and in circuit board design and manufacturing; and integrated circuit packaging, sin particular, will recognize that although gold has certain desirable electrical and chemical properties, it is an expensive element to include in a product or in a manufacturing process. In addition to being expensive, some manufacturing processes for applying gold require a wet chemical environment.

What is needed are methods and apparatus that are convenient and cost-effective for applying gold to portions of substrates, such as, circuit boards and integrated circuit packages.

SUMMARY OF THE INVENTION

Briefly, application of a conductive material onto selected pads of a circuit board, includes forming one or more conductive pad structures, or padstacks, by patterning a sheet that includes a stack of material layers. Such conductive pad structures may include a first conductive top layer, one or more underlying layers, and a bottom attachment layer, such as, a solder layer. The-top layer of one or-more padstacks are adhered to a soluble tape, and this composite structure is moved into place over a selected region of a substrate by means of a pick-and-place operation.

In a further aspect of the present invention, the placement of padstacks is followed by a solder reflow operation by which the padstacks are adhered to contact pads of the substrate.

In a still further aspect of the present invention, a wash with a solvent suitable to remove the soluble tape is performed.

BRIEF DESCRIPTION OF THE DRAWINGS

FIG. 4 is a top view of a patterned layer of gold pad structures illustrating that the gold pad structures may have a wide variety of shapes and sizes.

FIG. 5 is a side view of an illustrative multi-layer printed circuit board with solder paste disposed on a plurality of pads; and a pick-and-place mechanism holding a gold pad structure/soluble tape combination aligned above the printed circuit board for placement thereon.

FIG. 6 shows the structure of FIG. 5 after the gold pad structure/soluble tape combination has undergone a solder reflow operation.

FIG. 7 shows the structure of FIG. 6 after the soluble tape has been dissolved in a wash cycle.

DETAILED DESCRIPTION

Various embodiments of the present invention provide a new class of component for use in manufacturing electronic products including printed circuit boards, flex substrates, or integrated circuit packaging. More particularly, various embodiments of the present invention provide-pick-and place operations to provide a first material overlay disposed over a second material base layer.

In typical embodiments of the present invention, a first electrically conductive material is disposed over a second electrically conductive material and attached thereto. Although typical embodiments involve electrically conductive materials, it is noted that an electrically insulating material could also be disposed over, and attached to, an underlying material which itself is disposed on a substrate such as, for example, a circuit board.

Specific embodiments of the present invention provide for putting gold on pads of printed circuit boards, away from the edges of such printed circuit boards. Such selective application of gold by pick-and-place operations followed by a solder reflow, and wash cycle, provide for convenient and cost-effective creation of gold-plated contact pads on circuit boards.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Reference herein to "circuit boards", unless otherwise noted, is intended to include any type of substrate upon which a material may be selectively placed. For example, such substrates may be rigid or flexible, ceramic, flex, epoxy, FR4, or any other suitable material.

As noted above, some electrical or electronic products require a highly conductive material, such as gold, to be put on the pads of printed circuit boards. Conventionally, putting gold on pads of printed circuit boards that are located away from the edges of those boards can add 15% to 20% to the cost of each such board. Gold pads are often required for non-soldered, pressure connect mounting of land grid array (LGA) packages into sockets.

In one aspect of the present invention, a component is provided to more conveniently, efficiently, and cost-effectively provide for the application of a highly electrically conductive material, such as gold, onto a plurality of pads disposed on a board, such as a printed circuit board. Such a component may be referred to as a gold pad array, or may alternatively be referred to as a padstack.

Figure 1:
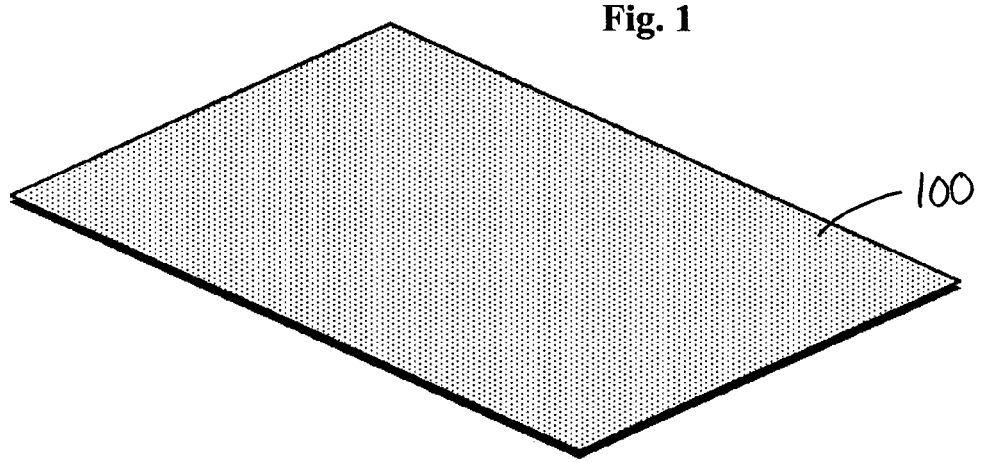
FIG. 1 illustrates a gold pad structure with solder on the bottom thereof in accordance with the present invention.

FIG. 1 illustrates a gold pad structure 100 in accordance with the present invention, that has gold on a first surface and solder on an opposing surface thereof. It is noted that although gold is a presently preferred material, the present invention is not limited to the use of gold, and that any material with the desired electrical, chemical, and/or physical properties may be used in conjunction with the present invention.

Figure 2:
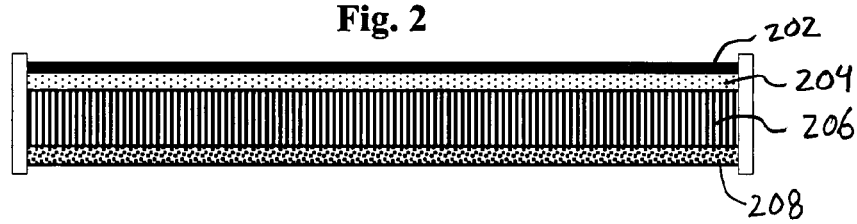
FIG. 2 is a cross-sectional view of a gold pad in accordance with the present invention, illustrating various layers of conductive material of the structure including a gold layer, a nickel layer subjacent the gold layer, a copper layer subjacent the nickel layer, and a solder layer subjacent the copper layer.

FIG. 2 is a cross-sectional view of gold pad structure 100, illustrating various layers of conductive material of the structure including a gold layer 202, a nickel layer 204 subjacent the gold layer, a copper layer 206 subjacent the nickel layer, and a solder layer 208 subjacent the copper layer. The copper layer may be referred to as a base layer. Gold pad structure 100 may be formed such that a material other than copper is selected as the base layer, for example, brass, or other metallic alloys; conductive plastic (intrinsic or filled with conductive particles); metallized organic fibers (random or woven); metallized perforated organic sheet; metallized perforated inorganic sheet; perforated organic sheet with conductive hole filler; or perforated inorganic sheet (with conductive hole filler) may be used. The solder layer may be disposed subjacent the copper layer of gold pad structure 100 by any suitable means, including but not limited to sputtering; electroplating; electroless plating; printing (stencil/screen); evaporating; dipping; laminating sheet stock. The solder layer is used as an attachment layer, typically for attaching a padstack to pads on a substrate such as a printed circuit board. The attachment layer may alternatively be formed from materials such as, but not limited to, flux, solder paste, or conductive ink.

Figure 3:
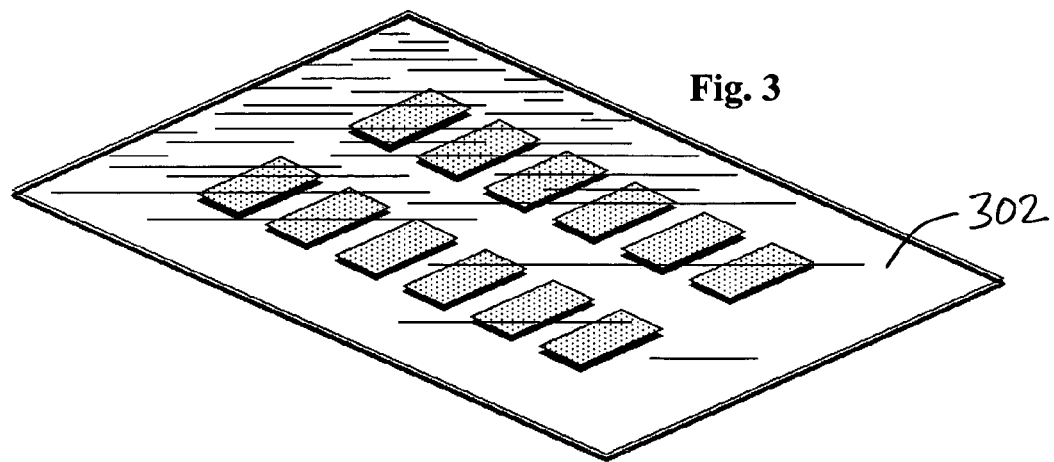
FIG. 3 illustrates a water soluble tape with a plurality of patterned gold pad structures disposed thereon, such that the solder layer is exposed and the gold layer is in contact with the water soluble tape.

FIG. 3 illustrates a water soluble tape 302 with a plurality of patterned gold pad structures 100 disposed thereon, such that the solder layer is exposed and the gold layer is in contact with the water soluble tape. In one embodiment of the present invention, the metal stack structure shown in FIG. 2 is formed on a tape backing and patterned to form individual gold pad structures 100. As illustrated in FIG. 3, the gold layer is adjacent the water soluble tape and the solder layer is exposed. This gold pad structure/soluble tape combination is used in accordance with methods of the present invention to provide gold-plated pads on circuit boards.

The water soluble tape is typically a poly-vinyl alcohol with synthetic water soluble adhesive. Such a water soluble tape is the Water-Soluble Wave Solder Tape-5414 available from 3M Corp.

FIG. 4 is a top view of a patterned layer of gold pad structures 100 illustrating that gold pad structures 100 may have a wide variety of shapes and sizes. The present invention is not limited to any particular shape or size of gold pad structures 100.

FIG. 5 is a side view of an illustrative multi-layer printed circuit board 502 with solder paste 504 disposed on a plurality of pads; and a pick and place mechanism 506 holding a gold pad structure/soluble tape combination 508 aligned above the printed circuit board 502 for placement thereon. The soluble tape 510 is preferably soluble in a solvent such as water, but the present invention is not limited to any particular solvent.

FIG. 6 shows the structure of FIG. 5 after the gold pad structure/soluble tape combination 508 has undergone a solder reflow operation. The solder reflow operation serves to attach the gold pad structure/soluble tape combination 508 to the underlying circuit board 502. The soluble tape backing provides mechanical support of the gold pad structures 100 until the solder reflow operation attaches the gold pad structures 100 to the circuit board 502.

FIG. 7 shows the structure of FIG. 6, after the soluble tape 510 has been dissolved in a wash cycle. It can be seen that after soluble tape 510 has been dissolved, the gold surface of gold pad structures 100 are present on the surface of the selected portions of the circuit board where the pick and place operation had disposed the gold pad structure/soluble tape combination.

Figure 8:
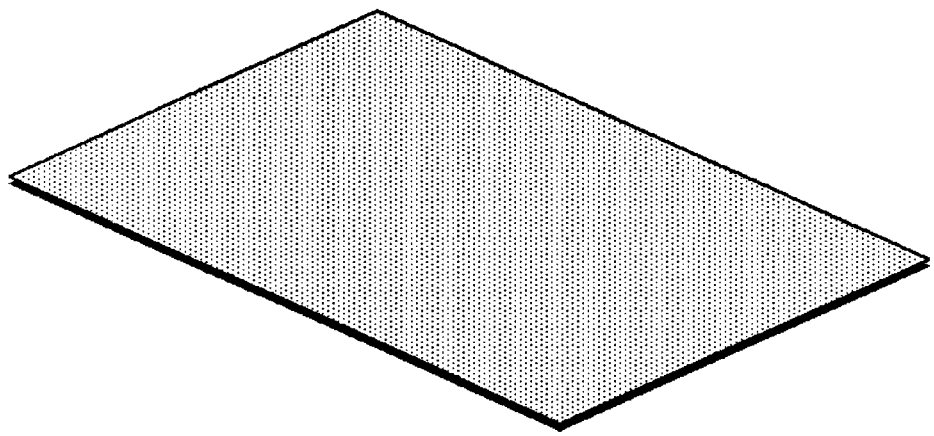
FIG. 8 shows a top view of an unpatterned stack of materials having gold as the top layer.

FIG. 8 shows a top view of an unpatterned stack of materials having gold as the top layer. In this illustrative embodiment, the stack has a top layer of gold, a nickel layer subjacent the gold layer, a copper layer subjacent the nickel layer and a solder layer subjacent the copper layer. It is noted that various embodiments of the present invention may use any suitable alternative material stacks.

Figure 9:
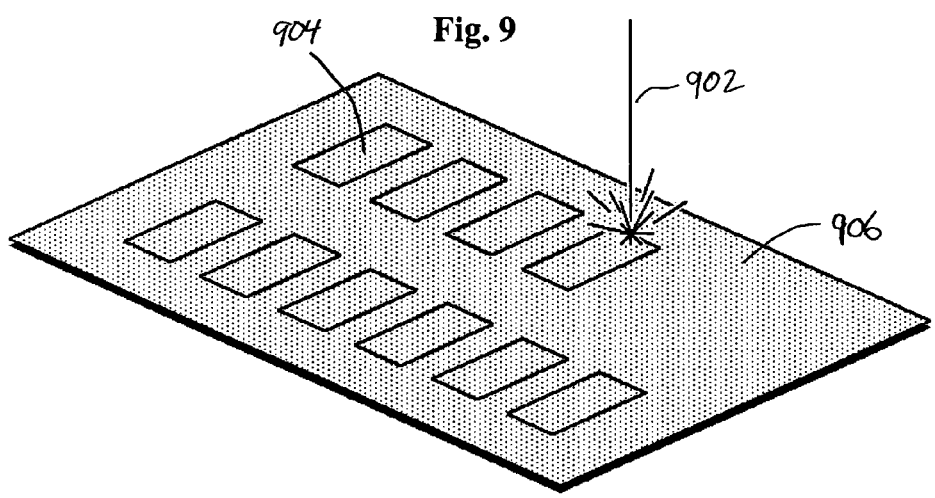
FIG. 9 shows the structure of FIG. 8 after both "field", and "gold pad" structures (i.e., padstacks) have been defined by way of a laser cutting, or etching, operation.

FIG. 9 shows the structure of FIG. 8 after both field, and gold pad structures (i.e., padstacks) have been defined, or patterned, by way of a laser culling, or etching, operation. A laser beam 902 is shown etching away material so as to isolate padstacks 904 from the field region 906. In typical embodiments of the present invention, lasers in the near infra-red, green, or ultraviolet wavelengths may be used. Patterning may alternatively be accomplished by means of, for example, a water-jet with abrasive content; laser energy delivered with a water-jet; a saw; a die cutter; an ion beam (not typically used for other than very small patterns); or an air driven abrasive stream.

With respect to the patterning operations described above, it is noted that laser etching may be performed from either the top side (i.e., gold-side in this example) or from the bottom side (i.e., the solder-side in this example).

Figure 10:
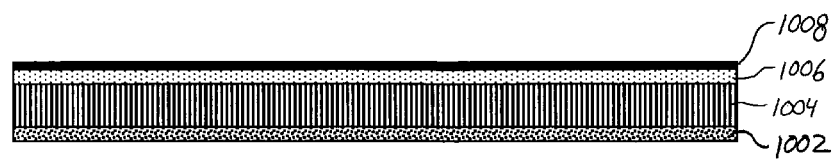
FIG. 10 is a cross-sectional view of an unpatterned stack of materials similar to that shown in FIG. 2, except the attachment layer is comprised of either flux, solder paste, or conductive ink.

FIG. 10 is a cross-sectional view of an unpatterned stack of materials similar to that shown in FIG. 2, except the attachment layer 1002 is comprised of either flux, solder paste, or conductive ink. In this illustrative embodiment a base layer 1004 is formed of copper, which has a nickel aver 1006 and a gold layer 1008 disposed above the base layer.

Figure 11:
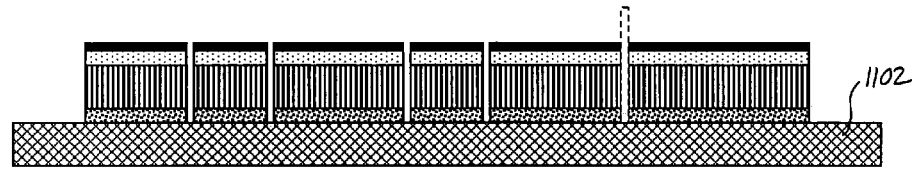
FIG. 11 is a cross-sectional view of the structure of FIG. 9, wherein the structure is disposed upon a fixture such as, for example, a vacuum hold down.
Figure 12:
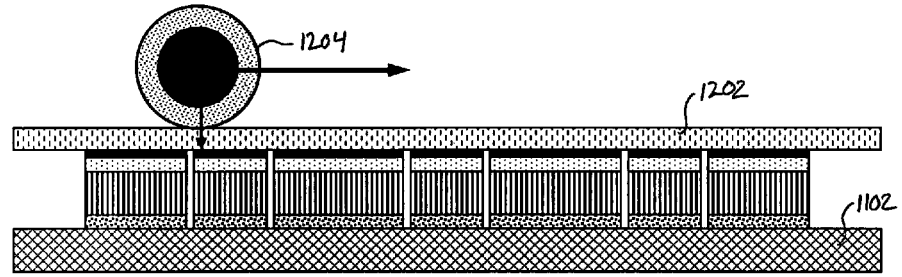
FIG. 12 is a cross-sectional view of the structure of FIG. 11, which also shows a water soluble tape being applied by a pressure roller.

FIG. 11 is a cross-sectional view of the structure of FIG. 9, wherein the structure is disposed upon a fixture 1102 such as, for example, a vacuum hold-down fixture. FIG. 12 is a cross-sectional view of the structure of FIG. 11, which also shows a water soluble tape 1202 being applied by a pressure roller 1204.

Referring to FIGS. 11–12, the unpatterned stack is placed solder-side down on hold-down fixture 1102, such as for example, a vacuum plate, or a vacuum chuck. Water soluble sticky tape 1202 is then applied to the top surface of the patterned stack of materials, in this example by means of roller 1204. By "top surface" in this context, the side of the material stack opposite the solder-side is being referred to. The padstacks are lifted away from the field portion of the material stack by the water soluble sticky tape It is noted that although a water soluble sticky tape is used in this example, the invention is not limited to tapes that are water soluble.

Figure 13:
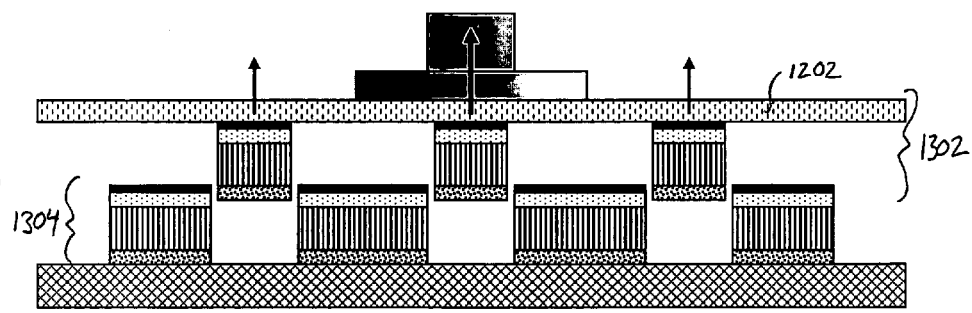
FIG. 13 is a cross-sectional view of a pick-and-place footprint for a gold pad structure in accordance with the present invention.

In an alternative embodiment,

FIG. 13 is a cross-sectional view of a pick-and-place footprint 1302 for a gold pad structure in accordance with the present invention as it is separated from a field region 1304 of the material stack, subsequent to the etching operation.

Figure 14:
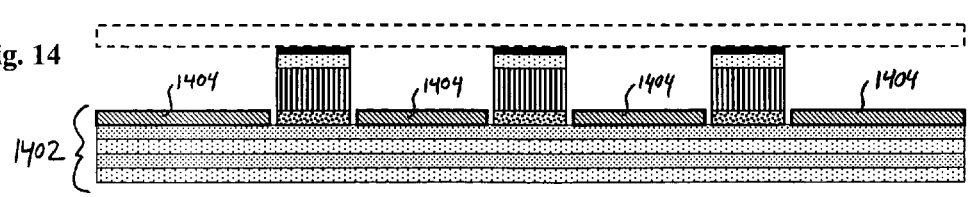
FIG. 14 is a cross-sectional view of the gold pad structure of FIG. 13, after that structure has been placed onto a substrate, such as, for example, a printed circuit board having a solder mask thereon.

FIG. 14 is a cross-sectional view of the gold pad structure of FIG. 13, after that structure has been placed onto a substrate 1402, such as, for example, a printed circuit board having a solder mask 1404 thereon.

Figure 15:
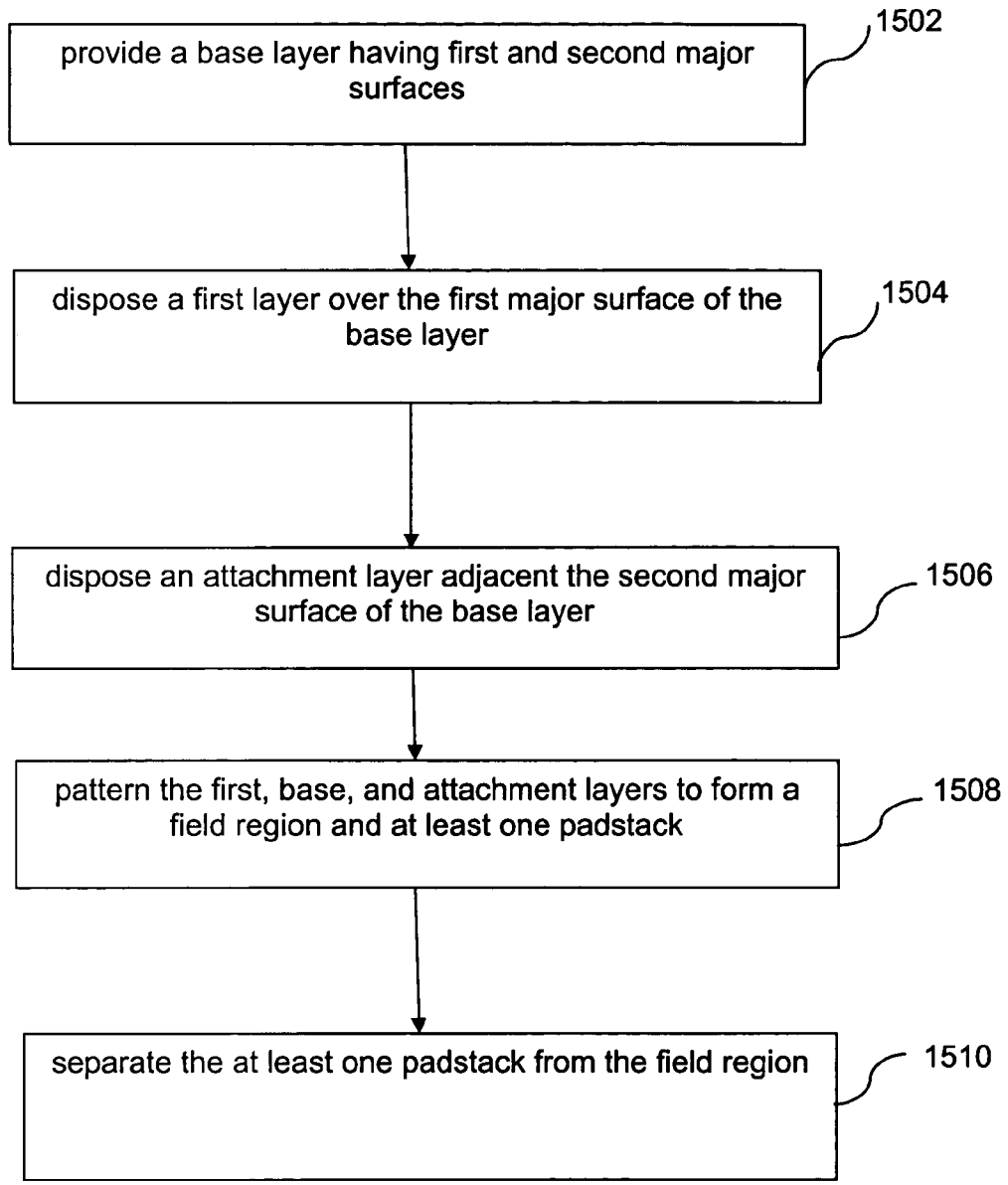
FIG. 15 is a flow diagram illustrating a method of making a structure in accordance with the present invention.

FIG. 15 is a flow diagram illustrating a method of making a structure in accordance with the present invention. In this illustrative embodiment, a base layer having a first major surface and a second major surface is provided 1502. The base layer is typically a sheet of metal. In various embodiments a cleaning operation may be performed on the base layer to remove, for example, oxidation or other contaminants. A first layer of material Is disposed 1504 over the first surface of the base layer. In various embodiments, There may be one or more intervening material layers disposed between the base layer and the first layer. An attachment layer is disposed 1506 adjacent the second major surface of the base layer. The first, base, and attachment levers are patterned 1508 so as to form at least one padstack that is isolated from the remainder of the material stack. The remainder of the material stack may be referred to as the "field region". After patterning, the at least one padstack is separated 1510 from the field region.

Figure 16:
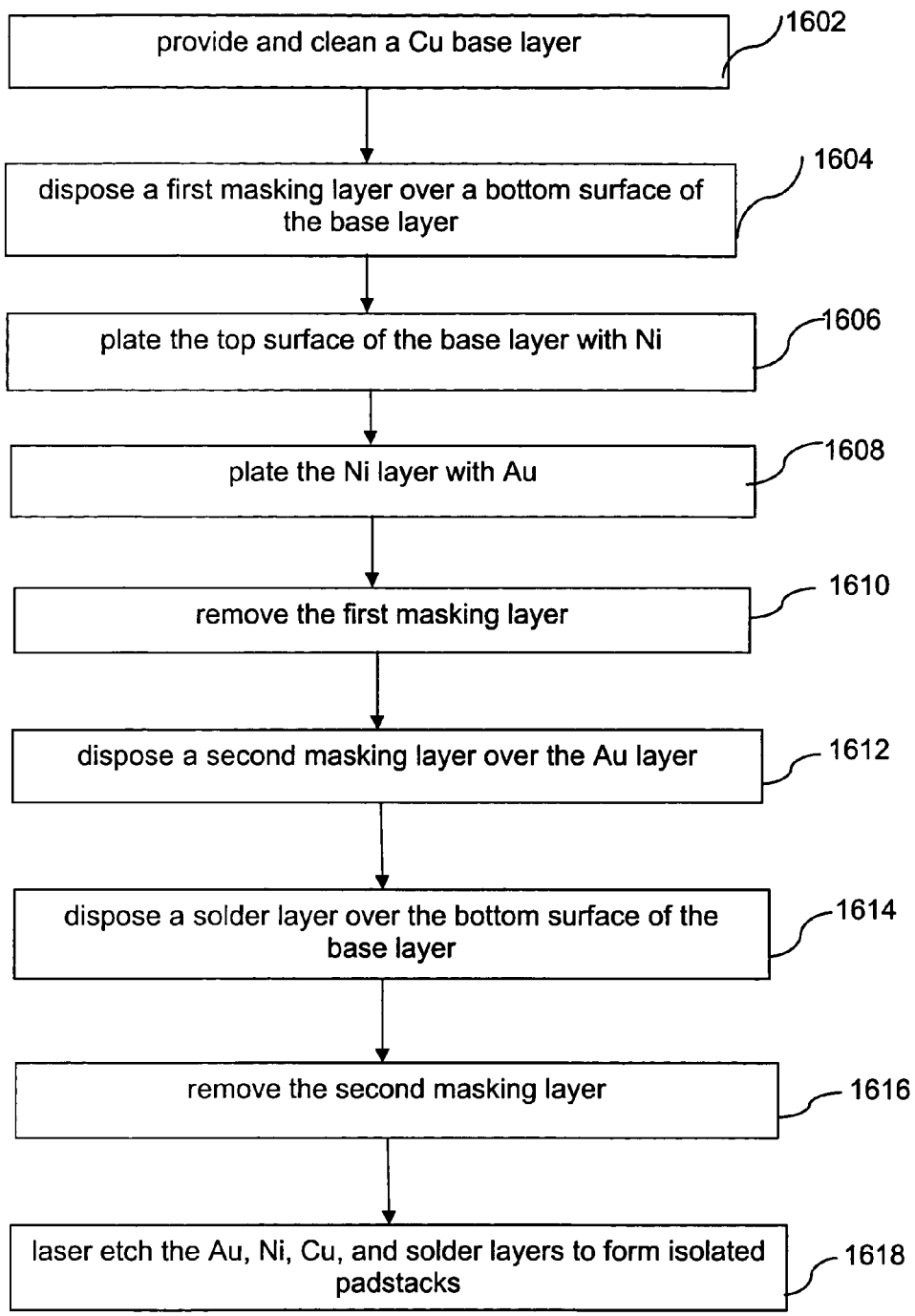
FIG. 16 is a flow diagram illustrating a method of making a structure in accordance with the present invention.

FIG. 16 is a flow diagram illustrating a method of making a padstack structure in accordance with the present invention. In this illustrative embodiment, a copper base layer is provided and cleaned 1602. A first masking layer is then disposed 1604 over a bottom surface of the base layer. It will be appreciated that references to "top" and "bottom" surfaces are for the convenience of description, and are not intended to be limitations on the particular spatial orientation structures in accordance with the present invention. The top surface of the base layer, which is not masked, is then plated 1606 with nickel. The nickel layer is then plated 1608 with gold to form a gold layer. The first masking layer is then removed 1610. A second masking layer is disposed 1612 over the gold layer. A solder layer is disposed 1614 over the bottom surface of the base layer. The second masking layer is then removed 1616. The gold, nickel, copper and solder layers are then laser etched 1618 to form isolated padstacks.

In typical embodiments, a padstack provides an electrically conductive pathway between its top and bottom surfaces. It is noted that alternative padstacks may include one or more layers that are not electrically conductive, such that an electrical pathway does not exist between the top and bottom surfaces of the padstack.

CONCLUSION

Various embodiments of the present invention include apparatus and methods for selectively applying a material to portions of a circuit board. More particularly, various embodiments of the present invention provide a structure suitable for use with existing pick-and-place equipment that can be placed on, and adhered to, a circuit board, and subsequently have an unneeded tape portion dissolved away.

Embodiments of the present invention may find application in the manufacture of in various electronic or opto-electronic products that include printed circuit boards, flex substrates, ceramic substrates, or similar elements.

An advantage of some embodiments of the present invention includes the cost-effective selective application of material, such as, for example, gold, to circuit boards.

Another advantage of some embodiments of the present invention includes the ability to use conventional pick-and-place tools to provide gold-plating for selective portions of circuit boards.

A still further advantage of some embodiments of the present invention includes selectively disposing gold contact regions on a circuit board without exposing the circuit board to wet chemical processing.

It is to be understood that the present invention is not limited to the embodiments described above, but encompasses any and all embodiments within the scope of the subjoined Claims and their equivalents.

What is claimed is:

1. A structure for use in applying conductive materials to a portion of a circuit board, comprising:
    a first conductive layer;
    a second conductive layer disposed over, and attached to, the first conductive layer;
    a third conductive layer disposed over, and attached to, the second conductive layer;
    a fourth conductive layer disposed over, and attached to, the third conductive layer; and
    a soluble tape disposed over, and attached to, the fourth conductive layer;
    wherein the first conductive layer comprises solder, the second conductive layer comprises copper, the third conductive layer comprises nickel, and the fourth conductive layer comprises gold.

2. The structure of claim 1, wherein the structure is adapted for use with a pick and place mechanism.

3. The structure of claim 1, wherein the soluble tape is a water soluble tape.

4. The structure of claim 1, wherein the soluble tape is formed of a material that is resistant to decomposition caused by an amount of heat to which the soluble tape is exposed during a solder reflow operation in which the structure is soldered to a circuit board.

5. The structure of claim 1, wherein the soluble tape is a poly-vinyl alcohol with synthetic water soluble adhesive.

6. A structure for applying conductive materials to a portion of a circuit board, comprising:
    a first conductive layer;
    a second conductive layer disposed over, and attached to, the first conductive layer;
    a third conductive layer disposed over, and attached to, the second conductive layer;
    a fourth conductive layer disposed over, and attached to, the third conductive layer; and
    a soluble tape disposed over, and attached to, the fourth conductive layer;
    wherein the first conductive layer comprises a material selected from the group consisting of solder, flux, wider paste, and conductive ink; and
    wherein the second conductive layer comprises a material selected from the group consisting of copper, brass, metallic alloys, conductive plastic, metallized organic fibers, metallized perforated organic sheet, metallized perforated inorganic sheet, perforated organic sheet with conductive hole filler, and perforated inorganic sheet with conductive hole filler; wherein the third conductive layer comprises nickel, and wherein the fourth conductive layer comprises gold.

* * * * *